(12) United States Patent
Segawa et al.

(10) Patent No.: US 8,174,633 B2
(45) Date of Patent: May 8, 2012

(54) DISPLAY DEVICE

(75) Inventors: Yasuo Segawa, Gifu (JP); Tomohide Onogi, Gifu (JP)

(73) Assignee: Sony Corporation, Tokyo (JP)

( * ) Notice: Subject to any disclaimer, the term of this patent is extended or adjusted under 35 U.S.C. 154(b) by 952 days.

(21) Appl. No.: 11/651,464

(22) Filed: Jan. 10, 2007

(65) Prior Publication Data

US 2007/0159565 A1 Jul. 12, 2007

(30) Foreign Application Priority Data

Jan. 11, 2006 (JP) ................................. 2005-003484

(51) Int. Cl.
G02F 1/136 (2006.01)
G02F 1/1343 (2006.01)

(52) U.S. Cl. ................................ 349/43; 349/38; 349/44

(58) Field of Classification Search .............. 349/28–44, 349/110; 257/59, 72

See application file for complete search history.

(56) References Cited

U.S. PATENT DOCUMENTS

| | | | |
|---|---|---|---|
| 6,327,006 B1 | 12/2001 | Sato et al. | |
| 6,573,955 B2 * | 6/2003 | Murade | 349/44 |
| 6,812,912 B2 * | 11/2004 | Miyajima et al. | 345/92 |
| 7,477,218 B2 * | 1/2009 | Koga et al. | 345/80 |
| 7,636,134 B2 * | 12/2009 | Yamasaki | 349/38 |
| 7,727,836 B2 * | 6/2010 | Yamazaki et al. | 438/241 |
| 2004/0239825 A1 | 12/2004 | Koide et al. | |

FOREIGN PATENT DOCUMENTS

| | | |
|---|---|---|
| JP | 2000-315798 | 11/2000 |
| JP | 2000-321601 | 11/2000 |
| JP | 2002-033481 | 1/2002 |
| JP | 2002-057341 | 2/2002 |
| JP | 2002-297058 | 10/2002 |
| JP | 2002-297060 | 10/2002 |
| JP | 2003-008026 | 1/2003 |
| JP | 2003-207807 | 7/2003 |
| JP | 2004-053630 | 2/2004 |
| JP | 2004-109857 | 4/2004 |
| JP | 2004-151546 | 5/2004 |
| JP | 2004-165241 | 6/2004 |
| JP | 2005-062416 | 3/2005 |
| JP | 2005-091819 | 4/2005 |
| KR | 2000-0029160 | 5/2000 |
| KR | 10-2004-0099160 | 11/2004 |

* cited by examiner

*Primary Examiner* — Dung T. Nguyen
(74) *Attorney, Agent, or Firm* — K&L Gates LLP

(57) ABSTRACT

The invention is directed to reduction of a leak current of a TFT of a pixel caused by light from a backlight or external light to improve a display quality of a liquid crystal display device. The display device of the invention includes a plurality of pixels on a first substrate, where each of the pixels includes a gate line intersecting a semiconductor layer with a gate insulation film interposed therebetween, a drain line connected to a drain region through a first contact hole and covering an upper side of the semiconductor layer extending from an intersection, and a source electrode connected to a source region through a second contact hole and covering an upper side of the semiconductor layer extending from an intersection. The device further includes a light shield layer formed under the semiconductor layer with a buffer film interposed therebetween and shielding the semiconductor layer from light.

12 Claims, 13 Drawing Sheets

DISPLAY DEVICE

CROSS-REFERENCE OF THE INVENTION

This application claims priority from Japanese Patent Application No. 2006-003484, the content of which is incorporated herein by reference in its entirety.

BACKGROUND OF THE INVENTION

1. Field of the Invention

The invention relates to a display device having a thin film transistor.

2. Description of the Related Art

A conventional liquid crystal display device (referred to as LCD, hereafter) has a plurality of pixels arrayed in a matrix of n rows and m columns, and each of the pixels includes a pixel selection thin film transistor 10 (referred to as a TFT 110, hereafter), a liquid crystal LC, and a storage capacitor Csc, as shown in FIG. 14. It is noted that FIG. 14 shows only the pixels in two rows and two columns for simplification of the figure.

A gate line 120 extending in the row direction is connected to a gate of the TFT 110, and a drain line 121 extending in the column direction is connected to a drain thereof. A gate scan signal is supplied from a vertical drive circuit (V drive circuit) 130 to the gate line 120 in each of the rows sequentially, and the TFT 110 is selected in response to this signal. A video signal is supplied to the drain line 121 in response to a horizontal scan signal from a horizontal drive circuit (H drive circuit) 140, and applied to the liquid crystal LC through the TFT 110. This changes the alignment state of liquid crystal molecules to make a display. The storage capacitor Csc is used for storing the video signal supplied through the TFT 110.

The TFT 110, the gate line 120, the drain line 121, the vertical drive circuit (V drive circuit) 130, and the horizontal drive circuit (H drive circuit) 140 are formed on a TFT substrate, and the liquid crystal LC is sealed between this TFT substrate and a common substrate.

Light of a backlight enters from the TFT substrate side to the LCD.

The relevant technology is disclosed in the Japanese Patent Application Publication No. 2004-165241.

In recent years, the luminance of light from the backlight is increasing together with the realization of higher resolution and higher color rendering of the LCD. Since light from the backlight generally enters from the TFT substrate side in a direct-view type LCD and thus a leak current in the TFT 110 irradiated with the light of the backlight increases, electric charge stored in the storage capacitor Csc leaks to cause degradation in contrast, a flicker, or a crosstalk, thereby providing a problem of degradation in a display quality. In a case where the intensity of incident light is extremely high like in a liquid crystal projector or a head-up display on a vehicle or in a case where there is a need to take into account light entering from both the sides of a liquid crystal panel, not only the incident light but also light reflected by the surface of the TFT substrate (a glass substrate) enters the TFT 110. Therefore, the leak current of the TFT 110 increases, thereby providing a problem of degradation in a display quality in the same manner as above.

SUMMARY OF THE INVENTION

A display device of the invention includes a pixel on a first substrate, the pixel including: a semiconductor layer bending in a U-shape; a gate line intersecting the semiconductor layer at first and second intersections with a gate insulation film interposed therebetween; a drain line connected to a drain region of the semiconductor layer through a first contact hole and covering an upper side of the semiconductor layer extending from the first intersection; a source electrode connected to a source region of the semiconductor layer through a second contact hole and covering an upper side of the semiconductor layer extending from the second intersection; a light shield layer formed under the semiconductor layer at the first and second intersections with a buffer film interposed therebetween and shielding the semiconductor layer from light; a capacitor line formed on the semiconductor layer with the gate insulation film interposed therebetween; and a pixel electrode connected to the source electrode.

DETAILED DESCRIPTION OF THE INVENTION

Figure 14:
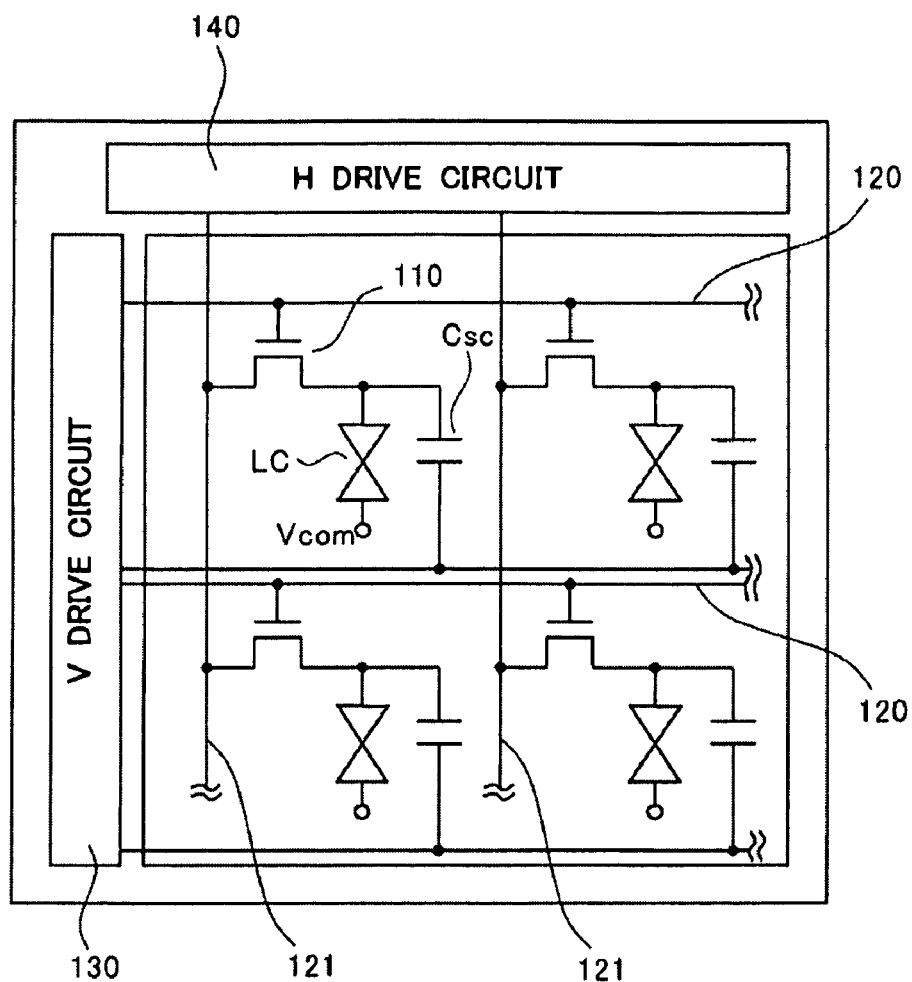
FIG. 14 is a circuit diagram of a liquid crystal display device of a conventional art.

A liquid crystal display device of a first embodiment of the invention will be described referring to figures. This liquid crystal display device has a plurality of pixels arrayed in a matrix of n rows and m columns, like the display device shown in FIG. 14. A TFT of each of the pixels is shielded from light by a drain line and a source electrode on its upper side and by a light shield layer on its lower side, so that light entering from above or under the liquid crystal display device or this reflected light is prevented from entering a depletion layer of a semiconductor layer of the TFT that is a source of a leak current.

Figure 1:
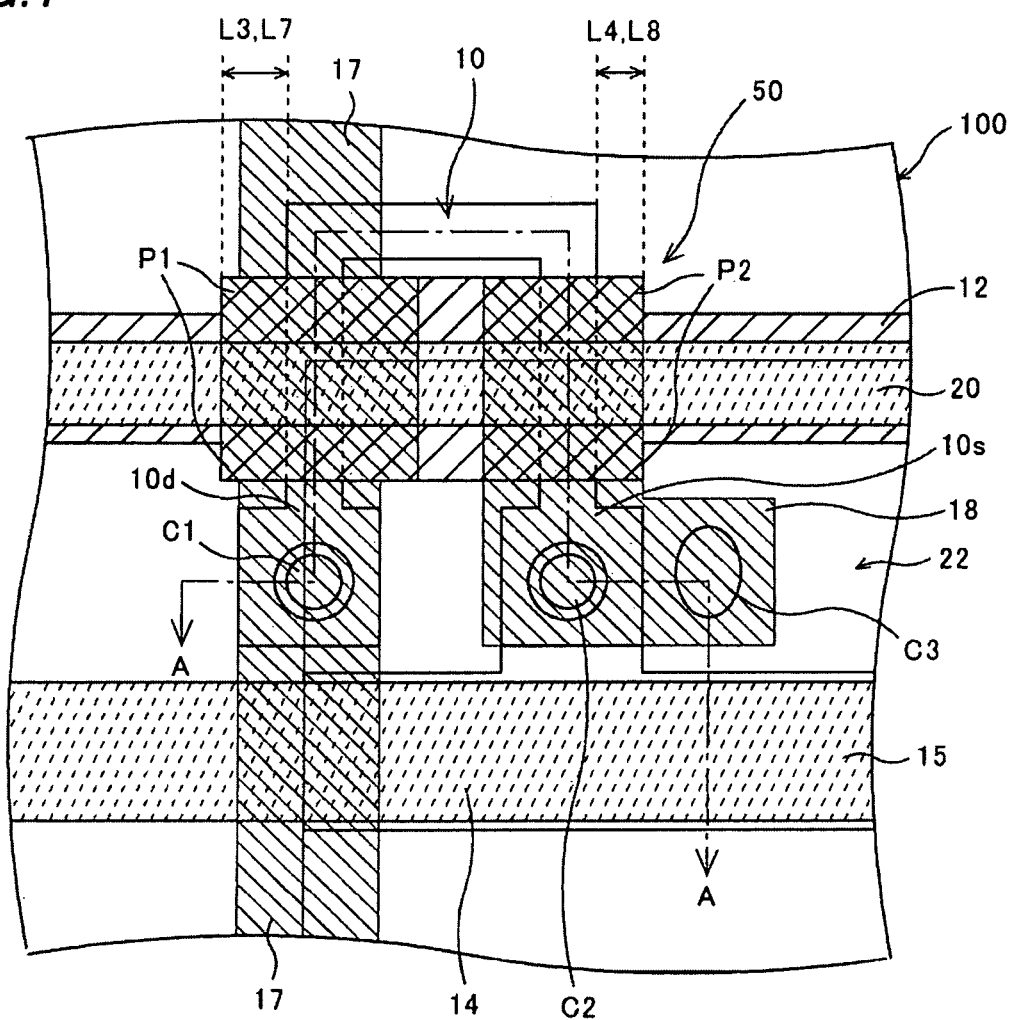
FIG. 1 is a plan view of a pixel of a liquid crystal display device of a first embodiment of the invention.
Figure 2:
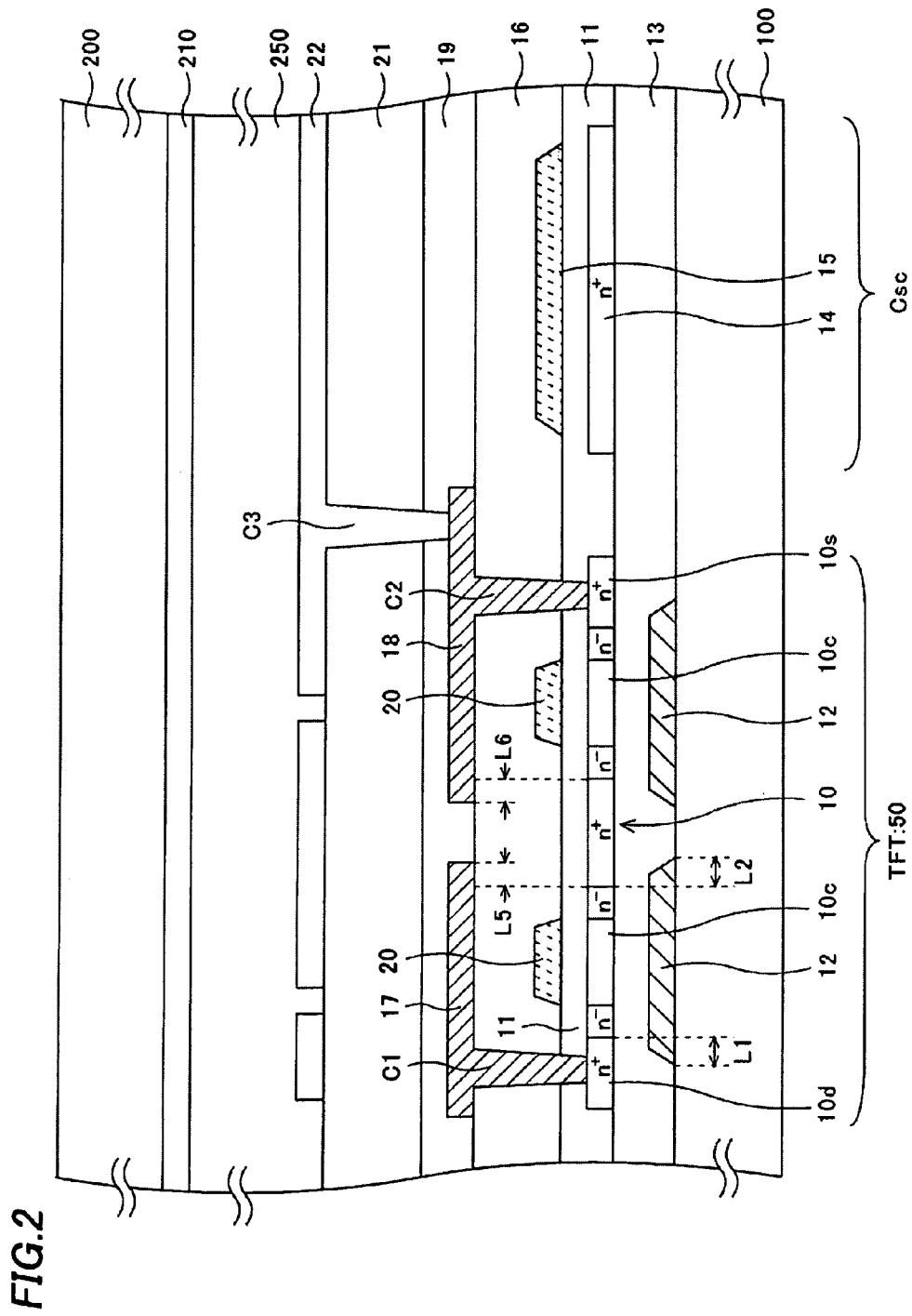
FIG. 2 is a cross-sectional view of FIG. 1 along line A-A.

FIG. 1 is a plan view of a pixel of this liquid crystal display device, and FIG. 2 is a cross-sectional view of FIG. 1 along line A-A. A semiconductor layer 10 (e.g. made of a polysilicon layer) of a TFT 50 (that corresponds to a TFT 110 of FIG. 14) is formed on a first substrate 100 (e.g. a glass substrate) to have a pattern bending in a U-shape, and intersects a gate line 20 that linearly extends in the row direction at two points. The semiconductor layer 10 is formed by laser-annealing an amorphous silicon layer deposited on the first substrate 100 by a CVD method to re-crystallize this into a polysilicon layer and patterning this polysilicon layer.

Two channel regions 10c and 10c are formed in the semiconductor layer 10 at these two intersections. The channel regions 10c and 10c are usually made of an intrinsic semiconductor layer, but can be made of a p-type semiconductor layer by threshold control instead.

A gate insulation film 11 is formed between the gate line 20 and the channel regions 10c and 10c. That is, the TFT 50 has a structure where two TFTs are serially connected to each other having a common gate. This TFT structure is called a double gate structure.

A drain region 10d including an n− region (a low concentration region) formed on the closer side to the gate line 20 and an n+ region (a high concentration region) formed adjacent thereto is formed in the semiconductor layer 10 extending from one intersection. In the similar manner, the semiconductor layer 10 extends from another intersection on the opposite side to the drain region 10d, and a source region 10s including an n− region formed on the closer side to the gate line 20 and an n+ region formed adjacent thereto is formed in this semiconductor layer 10. An n− region, an n+ region, and an n− region are formed between two channel regions 10c and 10c, too.

A light shield layer 12 made of chromium or molybdenum is formed under the semiconductor layer 10 at the two intersections, and a buffer film 13 made of $SiO_2$ or the like is formed between the light shield layer 12 and the semiconductor layer 10. The buffer film 13 is preferably 300 nm or more in thickness. This is because that a thinner buffer film 13 transfers heat generated in the laser-annealing to the light shield layer 12 therethrough, and a required amount of heat is not supplied to the amorphous silicon layer, thereby resulting in that the crystal grain size of the polysilicon layer is reduced and the reduction of carrier mobility degrades a current drive performance. When the thickness of the buffer film 13 is 300 nm or more, the required amount of heat is supplied to the amorphous silicon layer and the polysilicon layer can secure large crystal grain size.

The light shield layer 12 preferably covers the channel region 10c and the n− region entirely and further covers the n+ region by 2 µm or more or more preferably 3.5 µm or more from an end of the n− region. A leak current occurs in the TFT 50 by generation of a hole electron pair in a depletion layer when light enters there, the depletion layer being formed in a junction of the n− region and the channel region 10c by its depletion when reversely biased. Therefore, such a leak current can be prevented by covering the channel region 10c and the n− region entirely with the light shield layer 12. Covering the n+ region by 2 µm or more from the end of the n− region with the light shield layer 12 prevents light from obliquely entering the depletion layer from thereunder in FIG. 2. That is, L1, L2>2 µm in FIG. 2.

Furthermore, the light shield layer 12 is preferably extended to the outside of the TFT 50 in the channel width by 2 µm or more or more preferably 3.5 µm or more from an end of the semiconductor layer 10. That is, L3, L4>2 µm in FIG. 1. This makes it possible to shield the depletion layer from light entering from under the TFT 50 in the channel width direction (in the lateral direction in FIG. 1).

As shown in FIGS. 1 and 2, a storage capacitor Csc is formed in a region near the TFT 50. This storage capacitor Csc includes a lower electrode layer 14 continued to the source region 10c, a gate insulation film 11, and a storage capacitor line 15 formed thereon with this gate insulation film 11 interposed therebetween. An interlayer insulation film 16 is further formed covering the gate line 20 and the storage capacitor line 15. It is noted that a wiring layer is formed under the lower electrode layer 14 of the storage capacitor Csc with the buffer film 13 interposed therebetween using the same material as that of the light shield layer 12 in the same process of forming the light shield layer 12, and the value of the storage capacitor Csc can be increased by applying the same signal as that for the storage capacitor line 15 to this wiring layer.

A first contact hole C1 is formed on the n+ region of the drain region 10d, and a drain line 17 made of aluminum or aluminum alloy is connected to the drain region 10d through this first contact hole C1. This drain line 17 linearly extends in the column direction of the matrix, and covers a portion of the semiconductor layer 10 longitudinally extending from the intersection of the gate line 20 and the semiconductor layer 10. A second contact hole C2 is formed on the n+ region of the source region 10s, and a source electrode 18 made of aluminum or aluminum alloy is connected to the source region 10s through this second contact hole C2.

This drain line 17 extends from the first contact hole C1 onto the interlayer insulation film 16, covers the drain region 10d of the TFT 50, further extends over the gate line 20, and covers the n+ region by 2 µm or more from an end of the n− region on the opposite side, preferably. That is, L5>2 µm in FIG. 2. This is because that light can be prevented from entering the depletion layer of the n− region from thereabove. Covering the n+ region by 2 µm or more from the end of the n− region with the drain line 17 is for preventing light from obliquely entering from thereabove. For the same reason, the source electrode 18 extends from the second contact hole C2 onto the interlayer insulation film 16, covers the source region 10s of the TFT 50, further extends over the gate line 20, and covers the n+ region by 2 µm or more from an end of the n− region on the opposite side, preferably. L6>2 µm in FIG. 2.

Furthermore, it is preferable that the drain line 17 and the source electrode 18 are extended to the outside of the TFT 50 in the channel width by 2 µm or more from an end of the semiconductor layer 10. That is, L7, L8>2 µm in FIG. 1. This can prevent light from entering the depletion layer from above the TFT 50 in the channel width direction (in the lateral direction in FIG. 1).

Furthermore, the light shield layer 12 is formed in a region except under the first and second contact holes C1 and C2. When the light shield layer 12 is formed under the first and second contact holes C1 and C2, the first and second contact holes C1 and C2 may penetrate the semiconductor layer 10 and the buffer film 13 by over-etching in the formation of the contact holes, thereby causing a short circuit between the drain line 17 and the source electrode 18 and the light shield layer 12.

Furthermore, a passivation film 19 made of, for example, a silicon nitride film and a planarization film 21 made of a photosensitive organic material are formed covering the drain line 17 and the source electrode 18. A third contact hole C3 is formed in the passivation film 19 and the planarization film 21 on the source electrode 18, and a pixel electrode 22 made of ITO or the like is connected to the source electrode 18 through this third contact hole C3. A second substrate 200 is disposed being opposed to the first substrate 100 formed with the TFT 50 and the storage capacitor Csc, the second substrate 200 being formed with a common electrode 210 made of ITO or the like on its surface opposed to the first substrate 100. A liquid crystal 250 is sealed between the first substrate 100 and the second substrate 200. Alignment films are further formed covering the pixel electrode 22 and the common electrode 210 respectively although not shown in the figure.

Figure 3A:
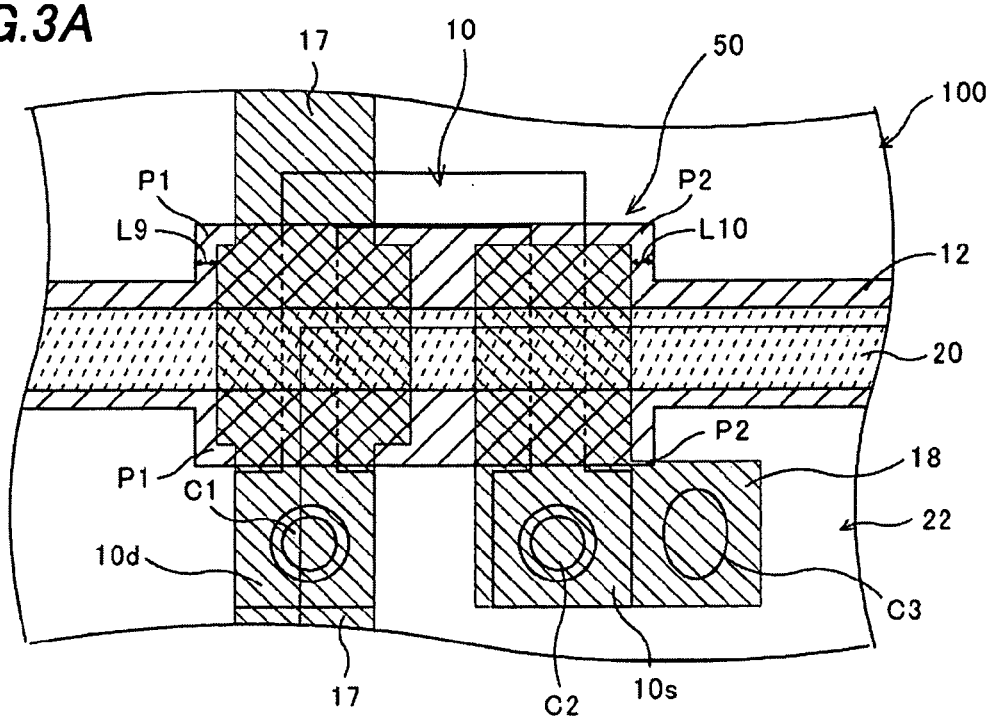
FIGS. 3A and 3B are other plan views of the pixel of the liquid crystal display device of the first embodiment of the invention.

Next, description will be given on correlation of patterns of the drain line 17, the source electrode 18, and the light shield layer 12. As shown in FIG. 1, the end of the drain line 17 and the end of the light shield layer 12 are aligned (in the positions indicated by P1 in FIG. 1) and the end of the source electrode 18 and the end of the light shield layer 12 are aligned (in the positions indicated by P2 in FIG. 1) at the two intersections of the semiconductor layer 10 and the gate line 12. However, when light enters the LCD mainly from the first substrate 100 side (e.g. when there is strong backlight entering the LCD), it is preferable that the end of the light shield layer 12 is extended to the outside of the ends of the source electrode 18 and the drain line 17 as shown in FIG. 3A. This is for preventing light that enters the LCD from the first substrate 100 side from being reflected by the source electrode 18 and the drain line 17 to enter the semiconductor layer 10.

Figure 3B:
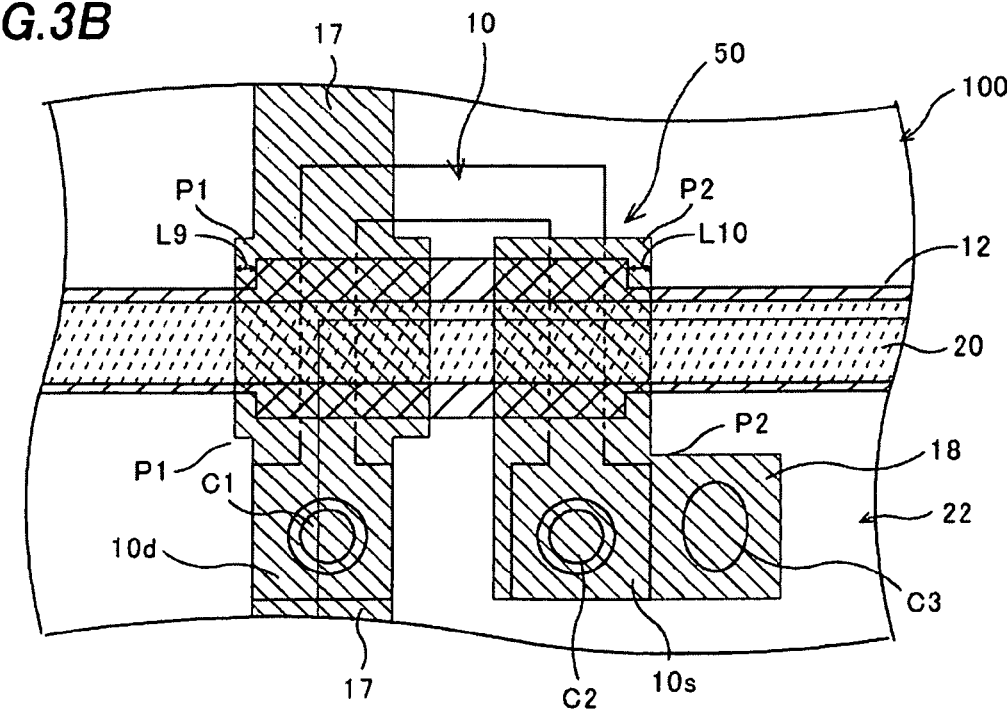

On the contrary, when light enters the LCD mainly from the second substrate 200 side, it is preferable that the ends of the source electrode 18 and the drain line 17 are extended to the outside of the end of the light shield layer 12 as shown in FIG. 3B. This is for preventing light that enters the LCD from the second substrate 200 side from being reflected by the light shield layer 12 or the like to enter the semiconductor layer 10.

Furthermore, it is preferable to set the light shield layer 12 at a predetermined potential and not in a floating state in order to prevent the change of the characteristics of the TFT 50 (e.g. the change of a threshold voltage). The potential of the gate line 20 and the potential of the storage capacitor line 15 are suitable for that potential. Therefore, it is necessary to connect the light shield layer 12 and the gate line 20 at a contact, and it is preferable to dispose the contact on the first substrate 100 except in a region where the pixel is formed. This is for preventing the reduction of the aperture ratio of the pixel. For the same reason, when the light shield layer 12 and the storage capacitor line 15 are connected through a contact, too, it is preferable to dispose this contact on the first substrate 100 except in the region where the pixel is formed.

Next, a liquid crystal display device of a second embodiment of the invention will be described referring to figures. This liquid crystal display device has a plurality of pixels arrayed in a matrix of n rows and m columns like the display device shown in FIG. 14, and a TFT in each of the pixels has the double gate structure. The second embodiment differs from the first embodiment in that an active layer of the TFT does not have a pattern of the U-shape but an L-shape and only the drain line shields the upper side of the TFT from light. The other features are the same as those of the first embodiment.

Figure 4:
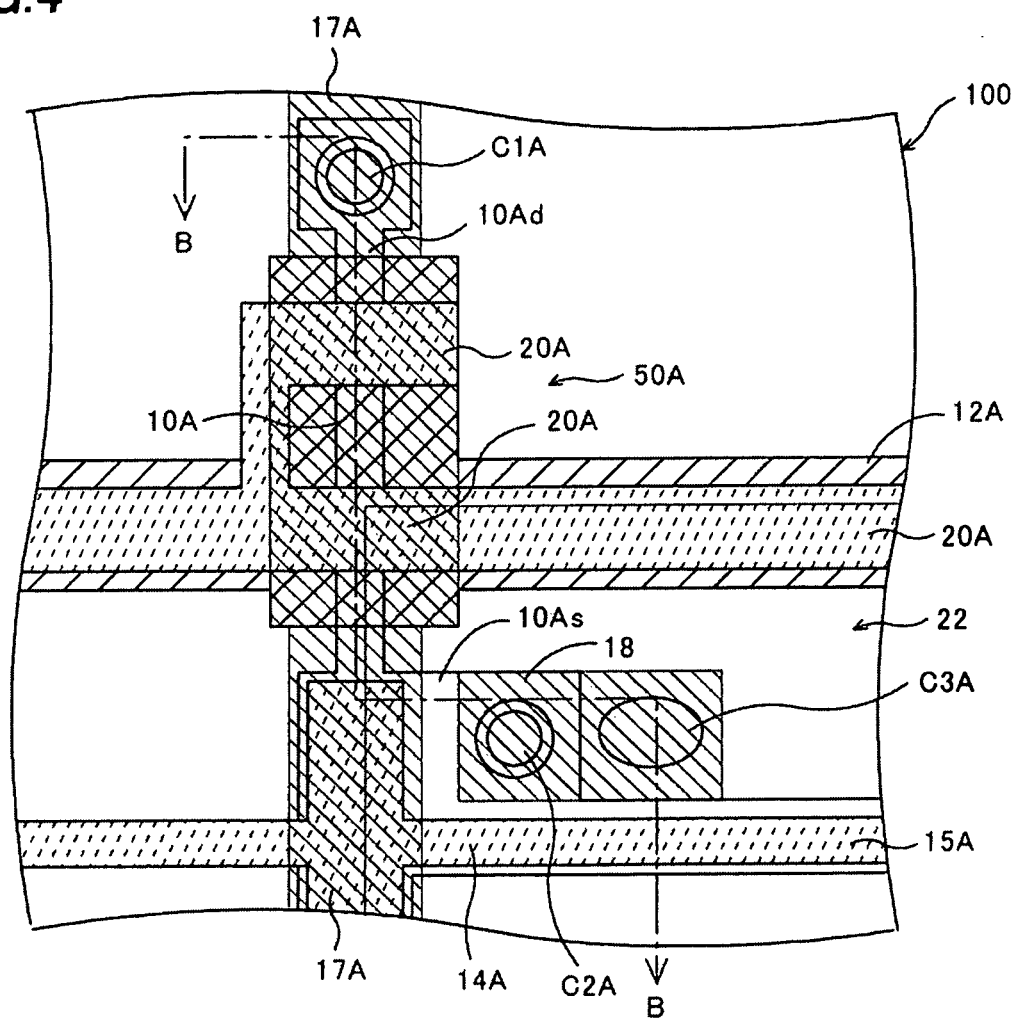
FIG. 4 is a plan view of a pixel of a liquid crystal display device of a second embodiment of the invention.
Figure 5:
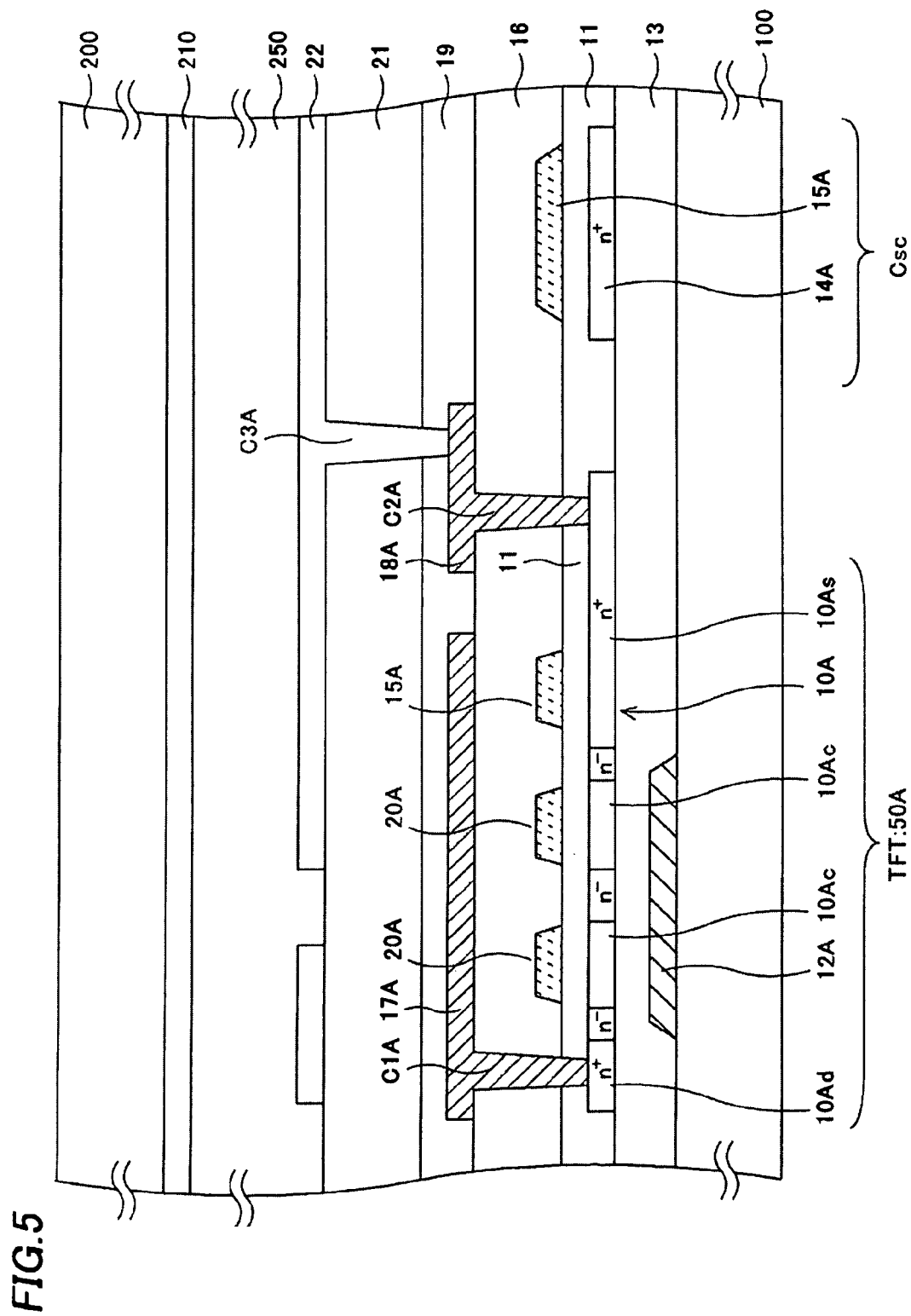
FIG. 5 is a cross-sectional view of FIG. 4 along line B-B.

FIG. 4 is a plan view of a pixel of this liquid crystal display device, and FIG. 5 is a cross-sectional view of FIG. 4 along line B-B. A semiconductor layer 10A (e.g. made of a polysilicon layer) of a TFT 50A (that corresponds to the TFT 110 of FIG. 4) is formed on the first substrate 100 (e.g. a glass substrate) to have the pattern of the L-shape. A gate line 20A linearly extending in the row direction branches out on the midway, and intersects a linear portion of the semiconductor layer 10A at two points with the gate insulation film 11 interposed therebetween.

Two channel regions 10Ac and 10Ac are formed in the semiconductor layer 10 at these two intersections. The gate insulation film 11 is formed between the gate line 20A and the channel regions 10Ac and 10Ac. That is, the TFT 50A has the double gate structure like the TFT in the first embodiment although the pattern is different from that of the TFT 50 of the first embodiment.

A drain region 10Ad including an n− region (a low concentration region) formed on the closer side to the gate line 20A and an n+ region (a high concentration region) formed adjacent thereto is formed in the semiconductor layer 10A extending from one of the intersections. In the similar manner, the semiconductor layer 10 extends from another intersection on the opposite side of the drain region 10Ad, and a source region 10As including an n− region formed on the closer side to the gate line 20A and an n+ region formed adjacent thereto is formed in this semiconductor layer 10A.

Furthermore, a light shield layer 12A made of chromium or molybdenum is formed under the semiconductor layer 10A at these two intersections, and the buffer film 13 made of $SiO_2$ or $SiN_X$ is formed between the light shield layer 12A and the semiconductor layer 10A. The light shield layer 12A preferably covers the channel region 10Ac and the n− region entirely, and further covers the n+ region by 2 μm or more or more preferably 3.5 μm or more from an end of the n− region. Covering the n+ region by 2 μm or more from the end of the n− region with the light shield layer 12A can prevent light from obliquely entering the depletion layer from thereunder in FIG. 5. Furthermore, the light shield layer 12A is preferably extended to the outside of the TFT 50A in the channel width by 2 μm or more or more preferably 3.5 μm or more from an end of the semiconductor layer 10A.

As shown in FIGS. 4 and 5, a storage capacitor Csc is formed in a region near the TFT 50A. This storage capacitor Csc is formed with a lower electrode layer 14A continued to the source region 10Ac and a storage capacitor line 15A formed thereon with the gate insulation film 11 interposed therebetween. An interlayer insulation film 16 is formed covering the gate line 20A and the storage capacitor line 15A.

A first contact hole C1A is formed on the n+ region of the drain region 10Ad, and a drain line 17A made of aluminum or aluminum alloy is connected to the drain region 10Ad through this first contact hole C1A.

This drain line 17A is linearly extended in the column direction of the matrix, and covers the gate line 20A and the semiconductor layer 10A. A second contact hole C2A is formed on the n+ region of the source region 10As, and a source electrode 18A made of aluminum or aluminum alloy is connected to the source region 10As through this second contact hole C2A. Furthermore, a pixel electrode 22 made of ITO or the like is connected to the source electrode 18A through a third contact hole C3A. The other structure is the same as that of the first embodiment, and the description thereof will be omitted.

Next, a liquid crystal display device of a third embodiment of the invention will be described referring to figures. This liquid crystal display device has a plurality of pixels arrayed in a matrix of n rows and m columns like the display device shown in FIG. 14, and a TFT in each of the pixels has a single gate structure. The third embodiment differs from the first embodiment in that the TFT has the single gate structure having a single gate and only the drain line shields an upper side of the TFT from light. The other features are the same as those of the first embodiment.

Figure 6:
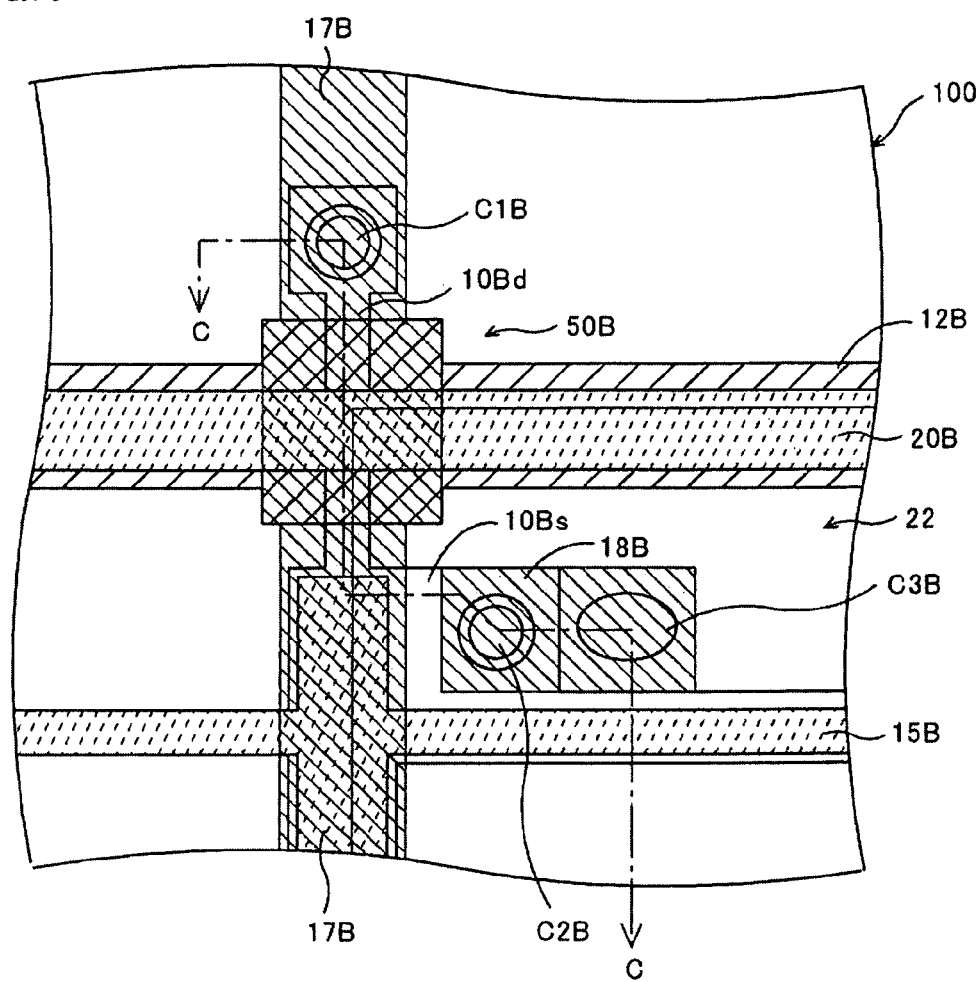
FIG. 6 is a plan view of a pixel of a liquid crystal display device of a third embodiment of the invention.
Figure 7:
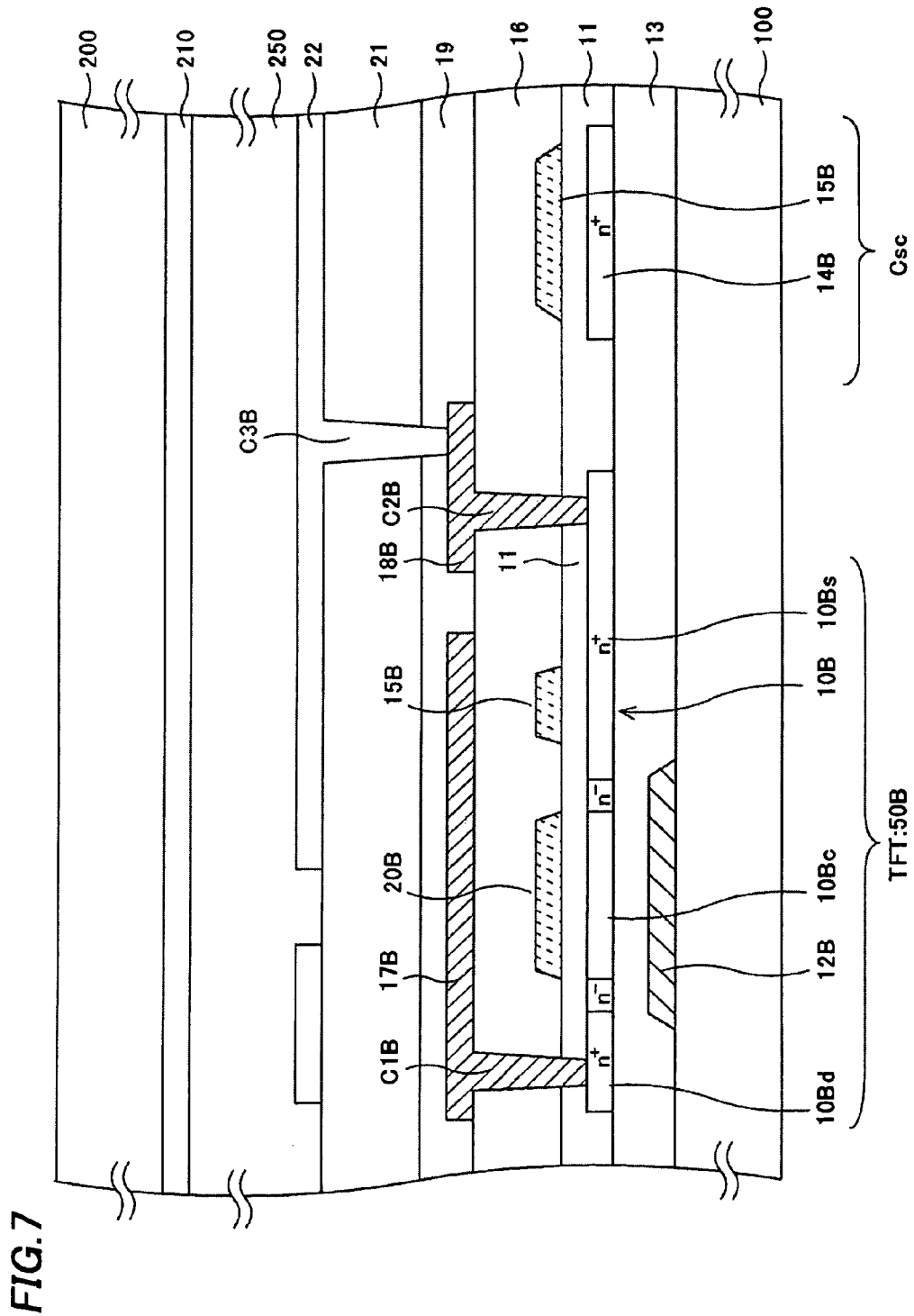
FIG. 7 is a cross-sectional view of FIG. 6 along line C-C.
Figure 8:
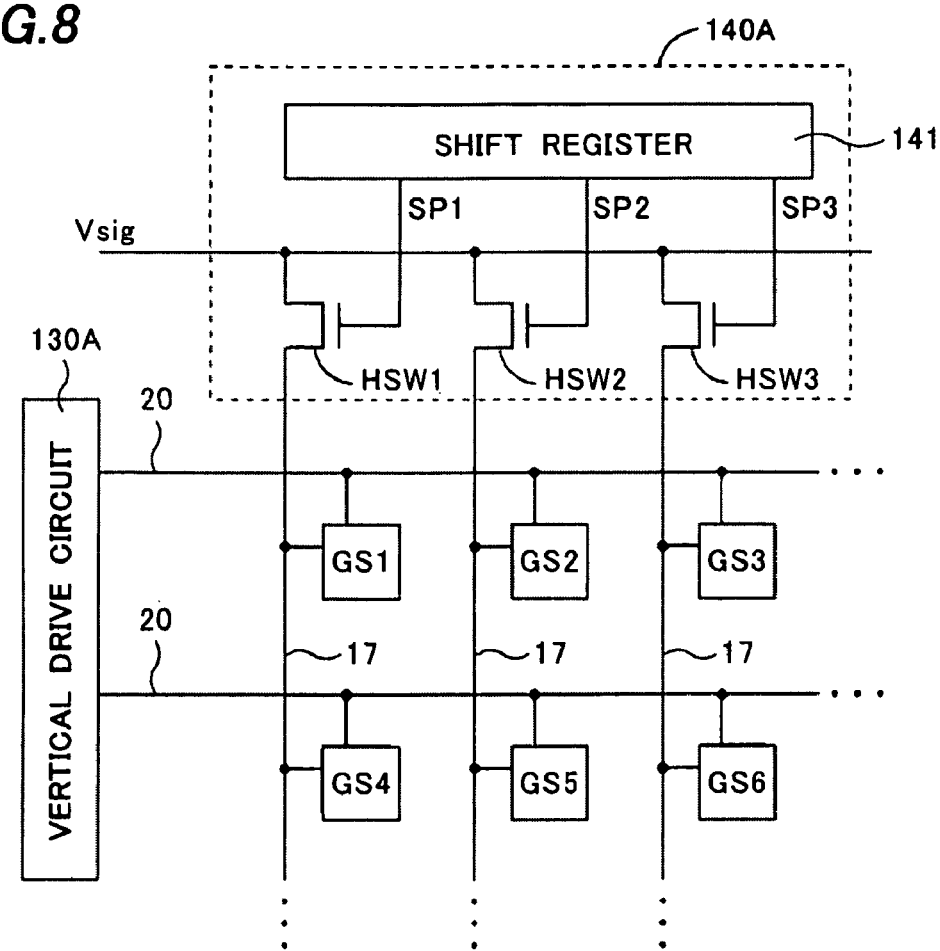
FIG. 8 is a circuit diagram of a liquid crystal display device of a fourth embodiment of the invention.
Figure 9:
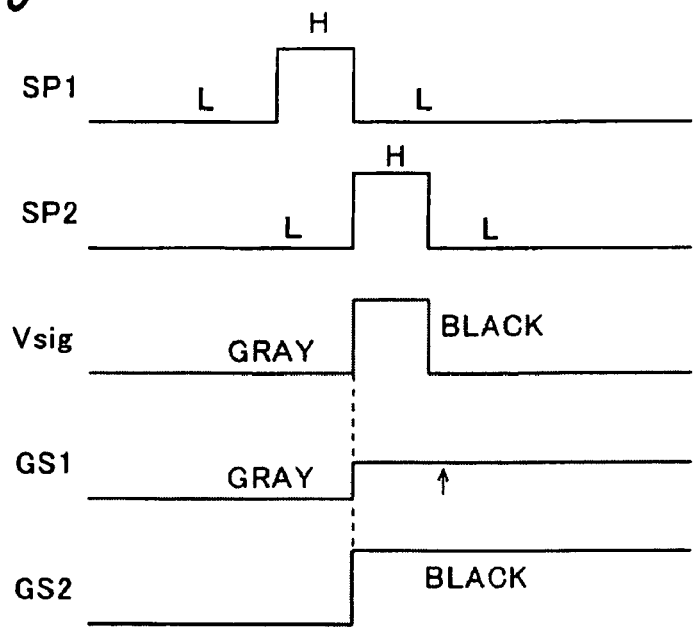
FIG. 9 is an operation timing graph for describing a crosstalk of a liquid crystal display device.

FIG. 6 is a plan view of a pixel of this liquid crystal display device, and FIG. 7 is a cross-sectional view of FIG. 6 along line C-C. A semiconductor layer 10B (e.g. made of a polysilicon layer) of a TFT 50B (that corresponds to the TFT 110 of FIG. 4) is formed on the first substrate 100 (e.g. a glass substrate) to have a pattern of an L-shape. A gate line 20B linearly extending in the row direction intersects the semiconductor layer 10B at a portion with the gate insulation film 11 interposed therebetween.

A channel region 10Bc is formed in the semiconductor layer 10B at this intersection.

The gate insulation film 11 is formed between the gate line 20B and the channel region 10B. That is, the TFT 50B has a different pattern from the TFT 50 of the first embodiment and has the single gate structure.

A drain region 10Bd including an n− region (a low concentration region) formed on the closer side to the gate line 20B and an n+ region (a high concentration region) formed adjacent thereto is formed in the semiconductor layer 10B extending from this intersection. In the similar manner, the semiconductor layer 10B extends to the opposite side of the drain region 10Bd, and a source region 10Bs including an n− region formed on the closer side to the gate line 20B and an n+ region formed adjacent thereto is formed in this semiconductor layer 10B.

Furthermore, a light shield layer 12B made of chromium or molybdenum is formed under the semiconductor layer 10B at the intersection, and the buffer film 13 made of $SiO_2$ or $SiN_X$ is formed between the light shield layer 12B and the semiconductor layer 10B. The light shield layer 12B preferably covers the channel region 10Bc and the n− region entirely, and further covers the n+ region by 2 μm or more or more preferably 3.5 μm or more from an end of the n− region. Covering the n+ region by 2 μm or more from the end of the n− region with the light shield layer 12B can prevent light from obliquely entering the depletion layer from thereunder in FIG. 7. Furthermore, the light shield layer 12B is preferably extended to the outside of the TFT 50B in the channel width by 2 μm or more or more preferably 3.5 μm or more from an end of the semiconductor layer 10B.

As shown in FIGS. 6 and 7, a storage capacitor Csc is formed in a region near the TFT 50B. This storage capacitor Csc is formed with a lower electrode layer 14B continued to the source region 10Bc and a storage capacitor line 15B formed thereon with the gate insulation film 11 interposed therebetween. Furthermore, the interlayer insulation film 16 is formed covering the gate line 20B and the storage capacitor line 15B.

A first contact hole C1B is formed on the n+ region of the drain region 10Bd, and a drain line 17B made of aluminum or aluminum alloy is connected to the drain region 10Bd through this first contact hole C1B.

This drain line 17B linearly extends in the column direction of the matrix, and covers the gate line 20B and the semiconductor layer 10B. A second contact hole C2B is formed on the n+ region of the source region 10Bs, and a source electrode 18B made of aluminum or aluminum alloy is connected to the source region 10Bs through this second contact hole C2B. A pixel electrode 22 made of ITO or the like is connected to the source electrode 18B through a third contact hole C3B. The other structure is the same as that of the first embodiment, and the description thereof will be omitted.

FIGS. 8-11 show a fourth embodiment of this invention. Although the first, second, and third embodiments provides the description on the structure for shielding the TFT of the pixel from light, this embodiment provides description on a structure for shielding a TFT forming a horizontal switch of a horizontal drive circuit from light. First, the relation of the pixel and the horizontal drive circuit will be described referring to FIG. 8.

This liquid crystal display device has a plurality of pixels GS1, GS2, GS3, and so on arrayed in a matrix. Each of the pixels has the structure shown in the first, second, and third embodiments. The gate line 20 extending in the row direction and the drain line 17 extending in the column direction are connected in each of the pixels. A gate scan signal is supplied from a vertical drive circuit 130A to the gate line 20 in each of the rows sequentially, and the TFT of the pixel turns on in response to this signal. A video signal Vsig is supplied from a horizontal drive circuit 140A to the drain line 17, and applied to a liquid crystal LC through the TFT of the pixel.

The horizontal drive circuit 140A has horizontal switches HSW1, HSW2, HSW3, and so on of which drains are connected to the drain lines 17 respectively and sources are supplied with a video signal Vsig, and a shift resistor 141 for supplying horizontal scan signals SP1, SP2, SP3, and so on to gates of the horizontal switches HSW1, HSW2, HSW3, and so on, respectively. The horizontal switches HSW1, HSW2, HSW3, and so on are made of TFTs, and turn on when the horizontal scan signals SP1, SP2, SP3, and so on turns to a high level and output a video signal Vsig to the corresponding drain lines 17.

A leak current occurs in the TFT forming these horizontal switches HSW1, HSW2, HSW3, and so on, too, when external light such as from a backlight enters there, thereby degrading the display quality by a crosstalk or the like. The problem of this crosstalk will be described referring to FIG. 9.

Now, a case where a gray display is to be made in the pixel GS1 and a black display is to be made in the pixel GS2 adjacent to the pixel GS1 will be considered. When the horizontal scan signal SP1 turns to a high level, the horizontal switch HSW1 turns on and a video signal Vsig of a gray level is written in the pixel GS1. Then, when the horizontal scan signal SP2 turns to a high level, the horizontal switch HSW2 turns on and a video signal Vsig of a black level is written in the pixel GS2. However, when a leak current occurs in the horizontal switch HSW1 during the horizontal switch HSW2 is turning on, the black level signal leaks to the pixel GS1, so that the display of the pixel GS1 becomes blackish. For preventing this crosstalk, it is necessary to provide the light shield structure in the horizontal switches HSW1, HSW2, HSW3, and so on.

Figure 10:
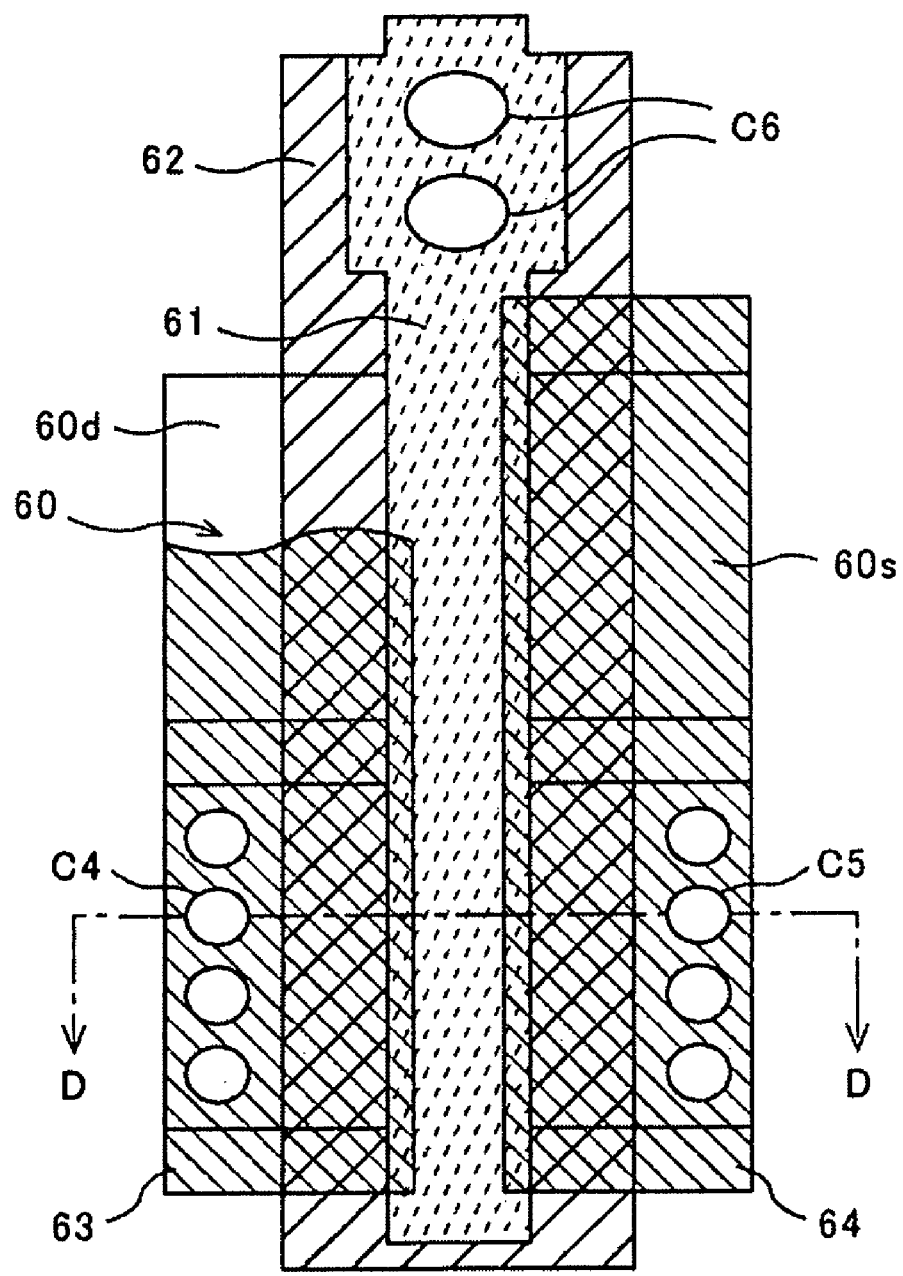
FIG. 10 is a plan view of a pixel of the liquid crystal display device of the fourth embodiment of the invention.
Figure 11:
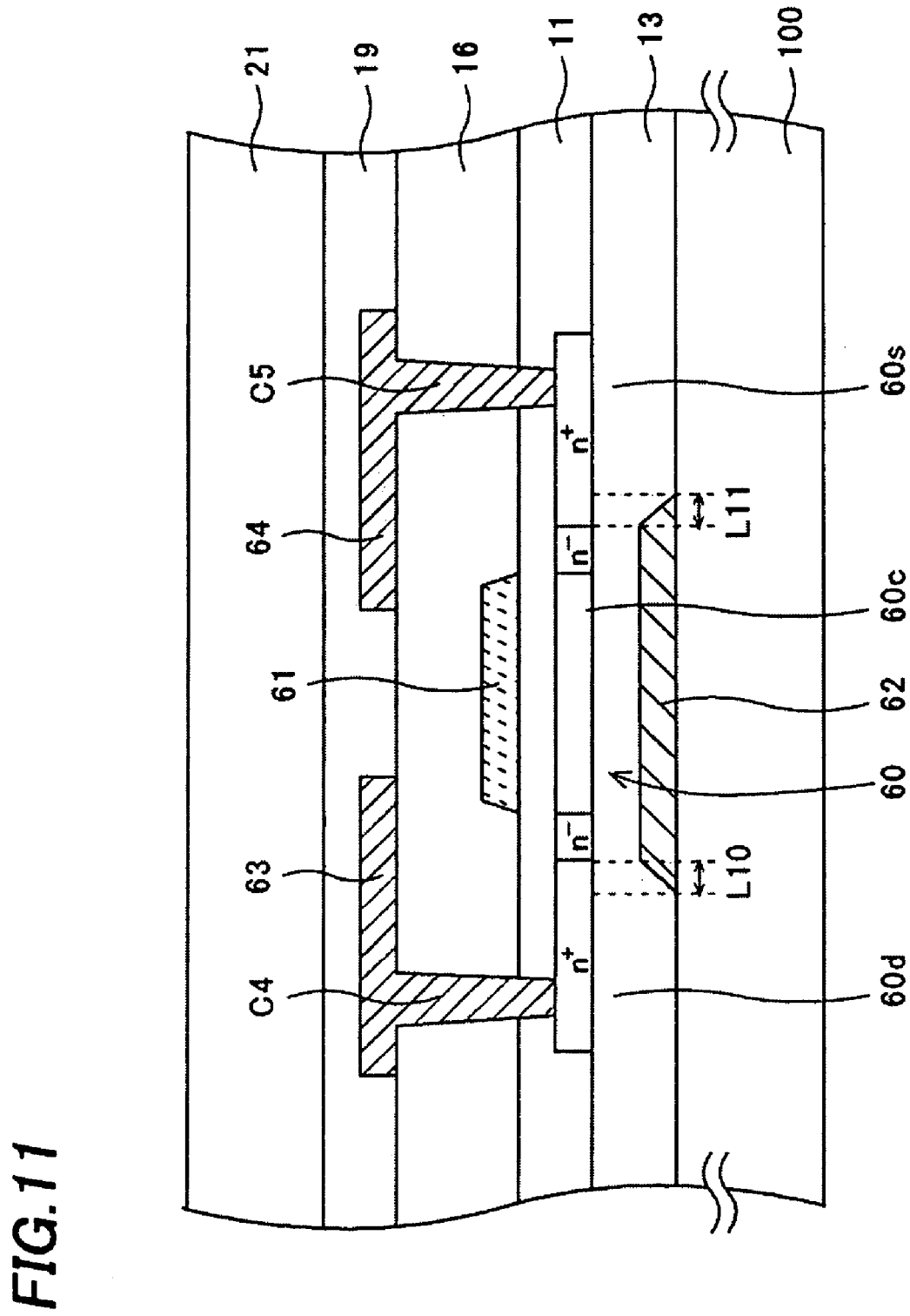
FIG. 11 is a cross-sectional view of FIG. 10 along line D-D.

FIG. 10 is a plan view of the TFT forming the horizontal switch, and FIG. 11 is a cross-sectional view of FIG. 10 along line D-D. A semiconductor layer 60 (e.g. made of a polysilicon layer) is formed on the first substrate 100 (e.g. a glass substrate), and a gate electrode 61 is formed on the semiconductor layer 60 with the gate insulation film 11 interposed therebetween. A p-type channel region 60c is formed in the semiconductor layer 60 under the gate electrode 61. A drain region 60d including an n− region (a low concentration region) and a n+ region (a high concentration region) formed adjacent thereto is formed in the semiconductor layer 60 adjacent to the channel region 60c. In the similar manner, a source region 60s including an n− region and an n+ region formed adjacent thereto is formed in the semiconductor layer 60, being opposed to the drain region 60d.

A light shield layer 62 made of chromium or molybdenum is formed under the semiconductor layer 60, and the buffer film 13 made of $SiO_2$ or $SiN_X$ is formed between the light shield layer 62 and the semiconductor layer 60. The buffer film 13 is preferably 300 nm or more in thickness for the above-described reason. The light shield layer 62 preferably covers the channel region 60c and the n− region entirely, and further covers the n+ region by 2 μm or more or more preferably 3.5 μm or more from an end of the n− region. That is, L10, L11>2 μm in FIG. Covering the n+ region by 2 μm or more from the end of the n− region with the light shield layer 62 can prevent light from obliquely entering the depletion layer from thereunder in FIG. 10. Furthermore, the light shield layer 62 is preferably extended to the outside of the TFT in the channel width by 2 μm or more or more preferably 3.5 μm or more from an end of the semiconductor layer 60. Furthermore, it is preferable to set the light shield layer 62 at a predetermined potential and not in a floating state for preventing the change of the characteristics of the TFT (e.g. the change of a threshold voltage). Therefore, the light shield layer 62 is connected to the gate electrode 61 through a contact hole C6 in this embodiment.

A contact hole C4 is formed in the gate insulation film 11 and the interlayer insulation film 16 on the n+ region of the drain region 60d, and a drain electrode 63 made of aluminum or aluminum alloy is connected to the drain region 60d through this contact hole C4.

This drain electrode 63 extends onto the interlayer insulation film 16 and overlaps the gate electrode 61. Therefore, the upper side of the n− layer of the drain region 60d is covered by the drain electrode 63, thereby preventing external light from entering this portion from thereabove.

In the similar manner, a contact hole C5 is formed in the gate insulation film 11 and the interlayer insulation film 16 on the n+ region of the source region 60s, and a source electrode 64 made of aluminum or aluminum alloy is connected to the source region 60s through this contact hole C5. This source electrode 64 extends onto the interlayer insulation film 16 and overlaps the gate electrode 61. Therefore, the upper side of the n− layer of the source region 60s is covered by source electrode 64, thereby preventing external light from entering this portion from thereabove. The passivation film 19 made of, for example, a silicon nitride film and the planarization film 21 made of a photosensitive organic material are formed covering the drain electrode 63 and the source electrode 64.

Figure 12:
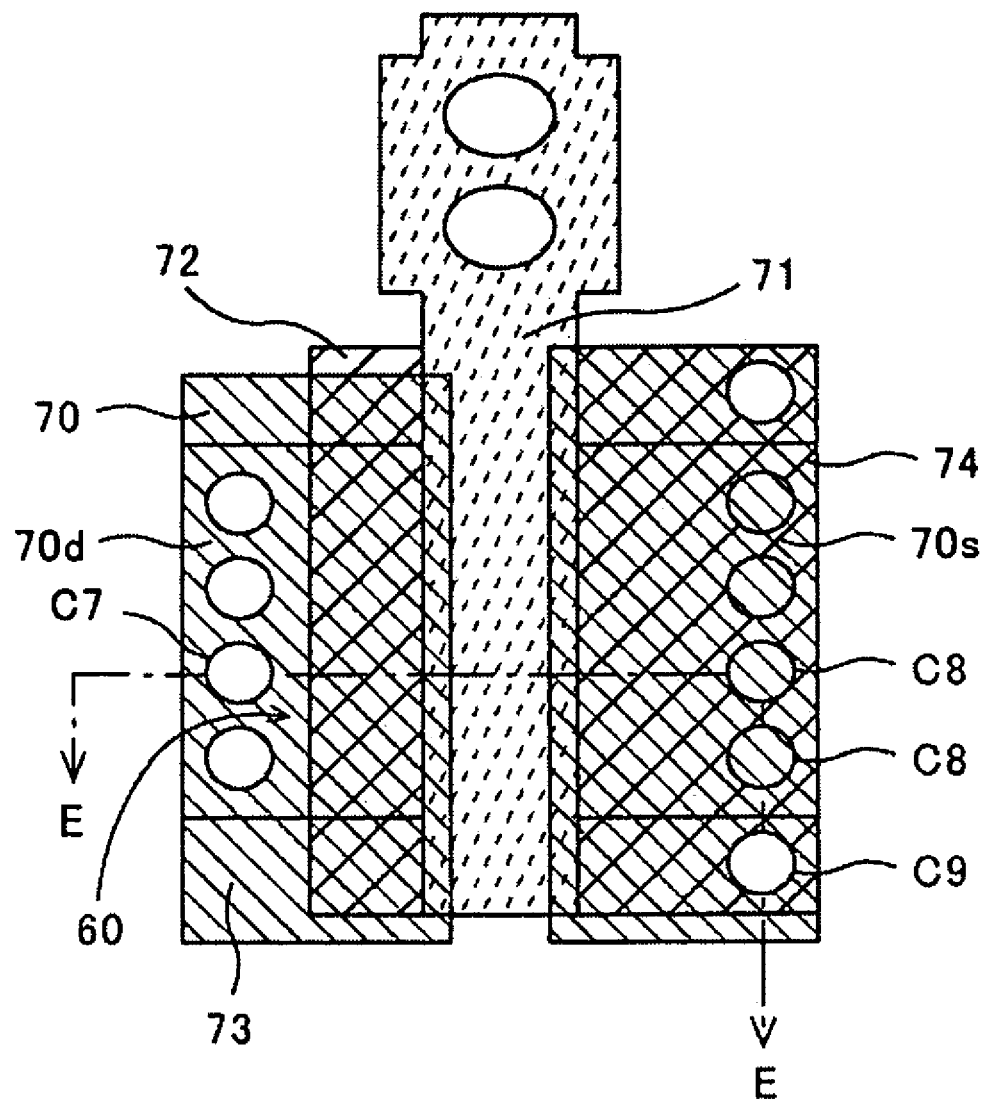
FIG. 12 is a plan view of a pixel of a liquid crystal display device of a fifth embodiment of the invention.
Figure 13:
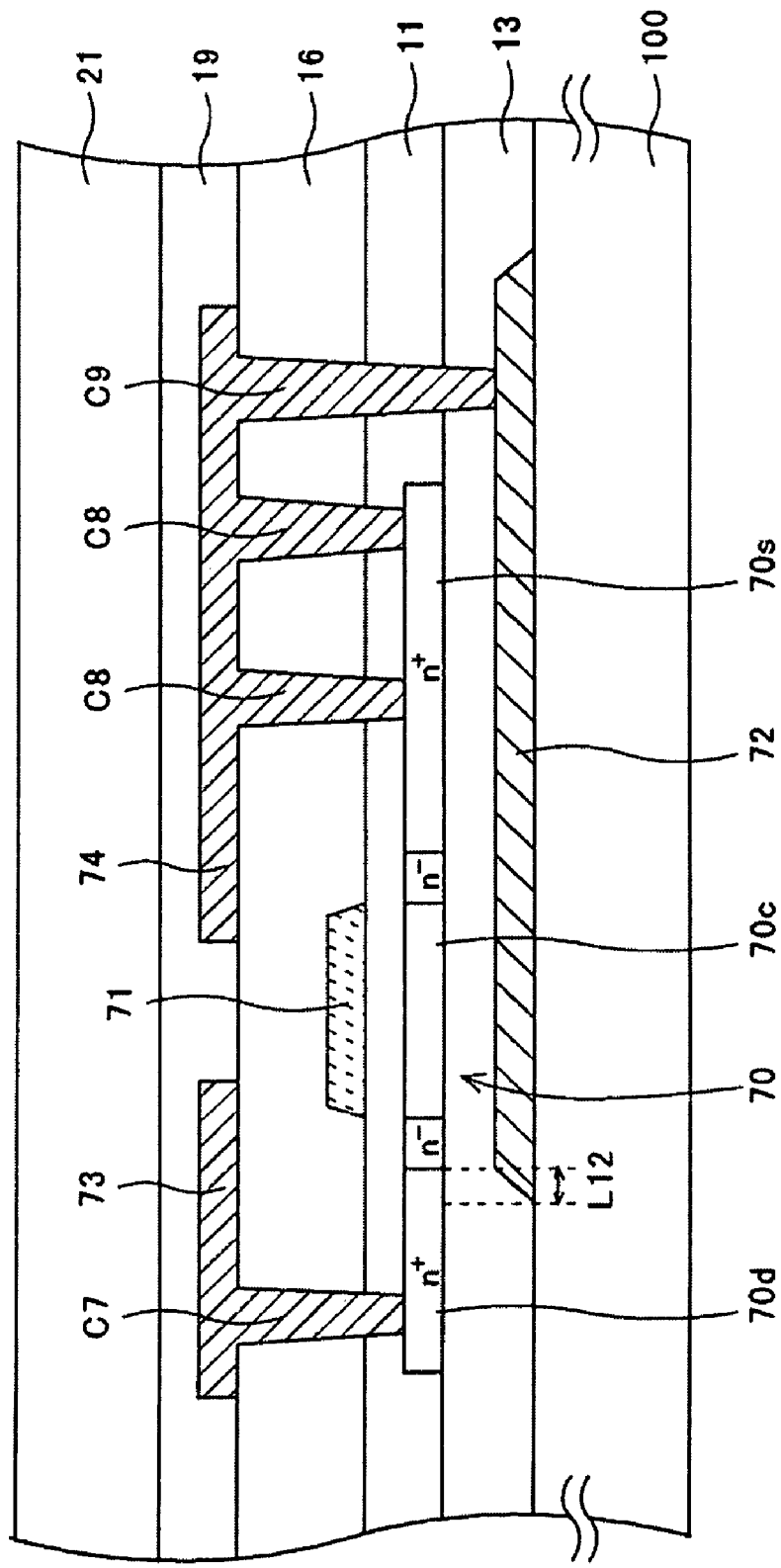
FIG. 13 is a cross-sectional view of FIG. 12 along line E-E.

FIGS. 12 and 13 show a fifth embodiment of the invention. Although the fourth embodiment provides the description on the light shield structure of the TFT used for the horizontal switch of the horizontal drive circuit, this embodiment provides description on a light shield structure of a TFT used for inverters of the horizontal drive circuit 140A and the vertical drive circuit 130A. A leak current occurs when external light such as from backlight enters this TFT, too, and this causes the misoperation of the inverters and the increase in current consumption, so that there is a need to use the similar light shield structure.

FIG. 12 is a plan view of the TFT forming the inverter, and FIG. 13 is a cross-sectional view of FIG. 12 along line E-E. The inverter is a circuit generally formed by serially connecting a P-channel type TFT and an N-channel type TFT between a power supply voltage VDD and a ground voltage VSS and commonly connecting those gates. FIGS. 12 and 13 show one of the TFTs only.

A semiconductor layer 70 (e.g. made of a polysilicon layer) is formed on the first substrate 100 (e.g. a glass substrate), and a gate electrode 71 is formed on the semiconductor layer 70 with the gate insulation film 11 interposed therebetween. A channel region 70c is formed in the semiconductor layer 70 under the gate electrode 71. A drain region 70d including an n− region (a low concentration region) and an n+ region (a high concentration region) formed adjacent thereto is formed in the semiconductor layer 70 adjacent to the channel region 70c. In the similar manner, a source region 70s including an n− region and an n+ region formed adjacent thereto is formed in the semiconductor layer 70, being opposed to the drain region 70d.

Furthermore, a light shield layer 72 made of chromium or molybdenum is formed under the semiconductor layer 70, and the buffer film 13 made of $SiO_2$ or the like is formed between the light shield layer 72 and the semiconductor layer 70. The buffer film 13 is preferably 300 nm or more in thickness for the above-described reason. The light shield layer 72 covers the channel region 70c and the n− region entirely, and further covers the n+ region by 2 μm or more or more preferably 3.5 μm or more from an end of the n− region. That is, L12>2 μm in FIG. 13. Covering the n+ region by 2 μm or more from the end of the n− region with the light shield layer 72 can prevent light from obliquely entering the depletion layer from thereunder in FIG. 13. Furthermore, the light shield layer 72 is preferably extended to the outside of the TFT in the channel width by 2 μm or more or more preferably 3.5 μm or more from an end of the semiconductor layer 70.

A contact hole C7 is formed in the gate insulation film 11 and the interlayer insulation film 16 on the n+ region of the drain region 70d, and a drain electrode 73 made of aluminum or aluminum alloy is connected to the drain region 70d through this contact hole C7.

This drain electrode 73 extends onto the interlayer insulation film 16, and overlaps the gate electrode 71. Therefore, the upper side of the n− layer of the drain region 70d is covered by the drain electrode 73, thereby preventing external light from entering this portion from thereabove.

In the similar manner, a contact hole C8 is formed in the gate insulation film 11 and the interlayer insulation film 16 on the n+ region of the source region 70s, and a source electrode 74 made of aluminum or aluminum alloy is connected to the source region 70s through this contact hole C8. This source electrode 74 extends onto the interlayer insulation film 16 and overlaps the gate electrode 71. Therefore, the upper side of the n− layer of the source region 70s is covered by the source electrode 74, thereby preventing external light from entering this portion from thereabove. The passivation film 19 made of, for example, a silicon nitride film and the planarization film 21 made of a photosensitive organic material are formed covering the drain electrode 73 and the source electrode 74.

It is preferable to set the light shield layer 72 at a predetermined potential and not in a floating state for preventing the change of the characteristics of the TFT (e.g. the change of a threshold voltage). Therefore, the light shield layer 72 is connected to the source electrode 74 to which a power supply voltage VDD or a ground voltage VSS is applied, through the contact hole C9, in this embodiment.

Although the first, second, and third embodiments provides the description on the structure for shielding the TFT of the pixel applicable to the liquid crystal display device from light, the invention can be applied to the other display device than the liquid crystal display device. For example, in a case of an OLED (organic light-emitting diode) display device that is a selfemissive display device, self-emitted light of a pixel or light emitted from the adjacent pixel is reflected by the front surface or the back surface of a glass substrate and enters a pixel selection TFT, thereby causing the increase in a leak current and degrading a display quality. In this case, a plurality of TFTs such as the pixel selection TFT, a drive TFT directly connected to the OLED that is a light emissive element, or the like are disposed in the pixel, and among these plurality of TFTs, at least the pixel selection TFT is shielded from light, having the same structure as that of the first, second, third embodiments.

In the liquid crystal display device of the embodiments of the invention, since the upper side of the semiconductor layer extending from the intersection of the semiconductor layer and the gate line is covered with the drain line or the source electrode and the light shield layer shielding the semiconductor layer from light is provided under the semiconductor layer of the intersection, light entering from above or under the liquid crystal display device or this reflected light is prevented from entering the semiconductor layer portion that is a source of the leak current. This reduces the leak current of the TFT of the pixel including the semiconductor layer, the gate insulation film, the gate line and so on, and the display quality of the liquid crystal display device can be improved.

What is claimed is:

1. A display device comprising a first substrate and a plurality of pixels provided on the first substrate, each of the pixels comprising:
- a semiconductor layer bending in a U-shape and comprising a first channel region, a second channel region, a drain region and a source region;
- a gate insulation film disposed on the semiconductor layer;
- a gate line disposed on the gate insulation film and intersecting the semiconductor layer over the first channel region and the second channel region;
- a drain line connected with the drain region and covering the first channel region;
- a source electrode connected with the source region and covering the second channel region;
- a light shield layer disposed under the gate line and under a portion of the semiconductor layer including the first and second channel regions, to cover the first and second channel regions so as to block light incident on the first substrate;
- a capacitor line disposed on the semiconductor layer so as to form a capacitor; and
- a pixel electrode connected with the source electrode,
- wherein the gate insulation film includes a first contact hole formed over the drain region and a second contact hole formed over the source region,
- wherein the first and second contact holes are formed between the gate line and the capacitor line,
- wherein the pixel electrode is formed to cover at least a portion of the drain line and at least a portion of the source electrode, and
- wherein the light shield layer is not formed in regions under the first and second contact holes.

2. The display device of claim 1, further comprising a second substrate disposed over the first substrate and a liquid crystal layer sealed between the first substrate and the second substrate.

3. The display device of claim 1, wherein the light shield layer and the gate line are set at the same potential.

4. The display device of claim 1, wherein the light shield layer and the capacitor line are set at the same potential.

5. The display device of claim 1, wherein a buffer film is 300 nm or more in thickness.

6. The display device of claim 1, wherein an end of the source electrode and an end of the drain line extend beyond an end of the light shield layer.

7. The display device of claim 1, wherein an end of the light shield layer extends beyond ends of the source electrode and the drain line.

8. The display device of claim 7, wherein the light shield layer extends beyond an end of the semiconductor layer by 2 μm or more.

9. The display device of claim 8, wherein the source electrode and the drain line extend beyond the end of the semiconductor layer by 2 μm or more.

10. The display device of claim 1, wherein the source region and the drain region comprise a low concentration region and a high concentration region respectively, and the light shield layer or the source electrode and the drain line covers the low concentration region entirely and further covers the high concentration region by 2 μm or more from an end of the low concentration region.

11. The display device of claim 1, wherein a first gate is formed over the first channel region and a second gate is formed over the second channel region, and the first and second channel regions are part of a thin film transistor having a double gate structure.

12. The display device of claim 1, wherein the drain line covers the first channel region and the source electrode covers the second channel region.

* * * * *

UNITED STATES PATENT AND TRADEMARK OFFICE
CERTIFICATE OF CORRECTION

PATENT NO. : 8,174,633 B2
APPLICATION NO. : 11/651464
DATED : May 8, 2012
INVENTOR(S) : Segawa et al.

It is certified that error appears in the above-identified patent and that said Letters Patent is hereby corrected as shown below:

On the title page, item [30] "Foreign Application Priority Data", replace
"Jan. 11, 2006 (JP)............2005-003484" with
--Jan. 11, 2006 (JP)............2006-003484--.

Signed and Sealed this
Eighteenth Day of June, 2013

Teresa Stanek Rea
*Acting Director of the United States Patent and Trademark Office*